(12) United States Patent
Schnappenberger et al.

(10) Patent No.: US 8,623,184 B2
(45) Date of Patent: Jan. 7, 2014

(54) DEVICE FOR SUPPORTING A ROTATABLE TARGET AND SPUTTERING APPARATUS

(75) Inventors: Frank Schnappenberger, Ingelheim (DE); Jürgen Multerer, Alzenau (DE)

(73) Assignee: Applied Materials, Inc., Santa Clara, CA (US)

(*) Notice: Subject to any disclaimer, the term of this patent is extended or adjusted under 35 U.S.C. 154(b) by 134 days.

(21) Appl. No.: 13/019,843

(22) Filed: Feb. 2, 2011

(65) Prior Publication Data
US 2012/0193218 A1    Aug. 2, 2012

(30) Foreign Application Priority Data
Jan. 28, 2011   (EP) ..................................... 11152612

(51) Int. Cl.
     *C23C 14/00*      (2006.01)

(52) U.S. Cl.
USPC .............. 204/298.11; 204/192.1; 204/192.12; 313/149; 285/411

(58) Field of Classification Search
USPC ............. 204/298.11, 192.1, 192.12; 313/149; 285/411
See application file for complete search history.

(56) References Cited

U.S. PATENT DOCUMENTS

| | | | |
|---|---|---|---|
| 5,100,527 A | 3/1992 | Stevenson et al. | |
| 5,213,672 A | 5/1993 | Hartig et al. | |
| 5,539,272 A * | 7/1996 | Taylor et al. | 313/149 |
| 5,567,289 A * | 10/1996 | Taylor et al. | 204/298.11 |
| 5,620,577 A | 4/1997 | Taylor | |
| 5,690,795 A * | 11/1997 | Rosenstein et al. | 204/192.1 |
| 6,365,010 B1 * | 4/2002 | Hollars | 204/192.12 |
| 2008/0012337 A1 * | 1/2008 | De Bosscher et al. | 285/411 |
| 2008/0264785 A1 | 10/2008 | De Bosscher et al. | |

FOREIGN PATENT DOCUMENTS

| | | |
|---|---|---|
| DE | 102007063362 B3 | 8/2009 |
| WO | WO-9518458 A1 | 7/1995 |

OTHER PUBLICATIONS

W.M. Haynes, "Thermal Conductivity of Ceramics and Other Insulating Materials", CRC Handbook of Chemistry and Physics, 92nd Edition.*
International search report and written opinion for PCT/EP2012/050105 dated Mar. 5, 2012.
Extended European Search Report for European Patent Application No. 11152612.5 dated Jun. 24, 2011.

* cited by examiner

*Primary Examiner* — Keith Hendricks
*Assistant Examiner* — Timon Wanga
(74) *Attorney, Agent, or Firm* — Patterson & Sheridan, LLP

(57) ABSTRACT

It is provided a device for supporting a rotatable target of a deposition apparatus for sputtering material onto a substrate, wherein the device includes a drive unit for rotating the rotatable target; a ring-shaped part connected to the drive unit for attaching the drive unit to the rotatable target; and, a shield for covering the ring-shaped part. The shield is adapted for rotating together with the ring-shaped part and includes a plurality of parts assembled together. Furthermore, a sputtering apparatus and a method for supporting a rotatable target are provided.

20 Claims, 7 Drawing Sheets

DEVICE FOR SUPPORTING A ROTATABLE TARGET AND SPUTTERING APPARATUS

FIELD OF THE INVENTION

The present disclosure relates to a device for supporting a rotatable target, particularly to a device having a target main body, an intermediate part for connecting the target main body to a drive unit for rotating the target and a dark room shield assembled to the intermediate part, and a method for supporting a rotatable target. In particular, embodiments of the present invention relate to nano-manufacturing technology solutions involving equipment, processes, and materials used in the deposition of thin films and coatings, with representative examples including (but not limited to) applications involving: semiconductor and dielectric materials and devices, silicon-based wafers, flat panel displays (such as TFTs), masks and filters, energy conversion and storage (such as photovoltaic cells, fuel cells, and batteries), solid-state lighting (such as LEDs and OLEDs), magnetic and optical storage, micro-electromechanical systems (MEMS) and nano-electro-mechanical systems (NEMS), micro-optic and optoelectronic devices, architectural and automotive glasses, metallization systems for metal and polymer foils and packaging, and micro- and nano-molding.

BACKGROUND OF THE INVENTION

In many applications it is desired to deposit thin layers on a substrate. Known techniques for depositing thin layers are, in particular, evaporating, chemical vapor deposition and sputtering deposition. For example, sputtering can be used to deposit a thin layer such as a thin layer of a metal, e.g. aluminum, or ceramics. During the sputtering process, the coating material is transported from a sputtering target consisting of material to be coated by bombarding the surface of the target with ions of a typically inert processing gas at low pressure. The ions are produced by electron impact ionization of the processing gas and accelerated by a large voltage difference between the target, operating as a sputtering cathode, and an anode. This bombardment of the target results in the ejection of atoms or molecules of the coating material, which accumulate as a deposited film on the substrate arranged opposite to the sputtering cathode, e.g. below the sputtering cathode.

Segmented planar, monolithic planar and rotatable targets may be used for sputtering. Due to the geometry and design of the cathodes, rotatable targets typically have a higher utilization and an increased operation time than planar targets. Accordingly, the use of rotatable targets typically prolongs service life and reduces costs.

A rotary cathode is typically supported by a cathode drive unit of the sputtering installation. During sputtering, the cathode drive unit rotatably transfers movement to the rotary cathode. Given longitudinal extensions of rotary cathodes of, for instance, up to about 4 m and typical continuous operation times of sputtering installations of several days, the bearing of the cathode drive unit is typically desired to reliably support heavy mechanical loads over a long period of time. Sputtering is typically carried out under low pressure or vacuum condition, i.e. in a vacuum chamber. For cost reasons, cathode drive units, in particular when arranged within a vacuum chamber of a sputtering installation, are also desired to consume a small amount of space.

To protect the cathode body from the gas discharge and resultant ion bombardment, dark room shields are provided at both the drive end and the free end of the cathode. They are mounted concentrically to the cathode, maintaining a fixed distance from the cathode surface. The shield around the drive end of the cathode body should prevent the processing gas discharge from contacting the drive end. The dark room shields are mounted on the chamber wall or the drive unit. The shield is electrically isolated from the mounting surface and acquires an electrical potential from the gas discharge.

During sputtering, a film of the depositing material grows onto the surface of the dark room shields, on the area of the dark room shield surface facing the substrate. Eventually, the formed film begins to break into chips or fragments, usually in areas where the film is thicker. If the resulting fragments of material fall onto the substrate, they obstruct deposition on the areas of the substrate which they fall on, resulting in defective products. Therefore, such a dark room shield has to be exchanged often, thus increasing the maintenance costs of the sputtering unit.

Accordingly, there is an ongoing need for an improved device and a method for supporting a rotatable target.

SUMMARY

In view of the above, according to an aspect, a device for supporting a rotatable target of a deposition apparatus for sputtering material on a substrate is provided. The device includes: a drive unit for rotating the target; a ring-shaped part connected to the drive unit for attaching the drive unit to the rotatable target; and a shield for covering the ring-shaped part such that the shield is adapted to rotate together with the ring-shaped part. The shield includes a plurality of parts assembled together.

Furthermore, a method is provided for supporting a rotatable target of a deposition apparatus for sputtering material on a substrate. The method includes providing a drive unit for rotating the rotatable target and a ring-shaped part connected to the rotatable target, and assembling a plurality of parts together thereby forming a shield for covering the ring-shaped part, wherein the shield is connected to the ring-shaped part such that it covers the ring-shaped part and rotates together with the ring-shaped part.

Further aspects, advantages and features of the present invention are apparent from the dependent claims, the description and the accompanying drawings.

BRIEF DESCRIPTION OF THE DRAWINGS

Some of the above mentioned embodiments will be described in more detail in the following description of typical embodiments with reference to the following drawings in which.

DETAILED DESCRIPTION

Reference will now be made in detail to the various embodiments, one or more examples of which are illustrated in each figure. Each example is provided by way of explanation and is not meant as a limitation. For example, features illustrated or described as part of one embodiment can be used on or in conjunction with other embodiments to yield yet further embodiments. It is intended that the present disclosure includes such modifications and variations.

Sputtering is a process in which atoms are ejected from a solid target material due to bombardment of the target by energetic particles. The process of coating a substrate as a material at the scraping refers typically to thin film applications. The term "coating" and the term "depositing" are used interchangeably herein. The terms "sputtering installation" and "deposition apparatus" are used interchangeably herein and shall refer to an apparatus which uses sputtering for depositing a target material, typically as a thin film, on a substrate.

Typical target materials include (but are not limited to) pure metals such as aluminum (Al), copper (Cu), silver (Ag) and gold (Au); metal alloys such as an aluminum-niobium (AlNb) alloy or an aluminum-nickel (AlNi) alloy; semiconductor materials such as silicon (Si); and dielectric materials such as nitrides, carbides, titanates, silicates, aluminates and oxides, e.g. transparent conducting oxides (TCO) such as impurity-doped ZnO, e.g. ZnO:Al, AlZnO, $In_2O_3$, $SnO_2$ and CdO, as well as Sn-doped $In_2O_3$ (ITO) and F-doped $SnO_2$.

The term "substrate" as used herein shall refer to both inflexible substrates, e.g., a wafer or a glass plate, and flexible substrates, such as, webs and foils. Representative examples include (but are not limited to) applications involving: semiconductor and dielectric materials and devices; silicon-based wafers; flat-panel displays (such as TFTs); masks and filters; energy conversion and storage (such as photovoltaic cells, fuel cells, and batteries); solid-state lighting (such as LEDs and OLEDs); magnetic and optical storage; micro-electro-mechanical systems (MEMS) and nano-electro-mechanical systems (NEMS); micro-optic and opto-elecro-mechanical systems (NEMS), micro-optic and optoelectronic devices; transparent substrates; architectural and automotive glasses; metallization systems for metal and polymer foils and packaging; and micro- and nano-molding.

Figure 1:
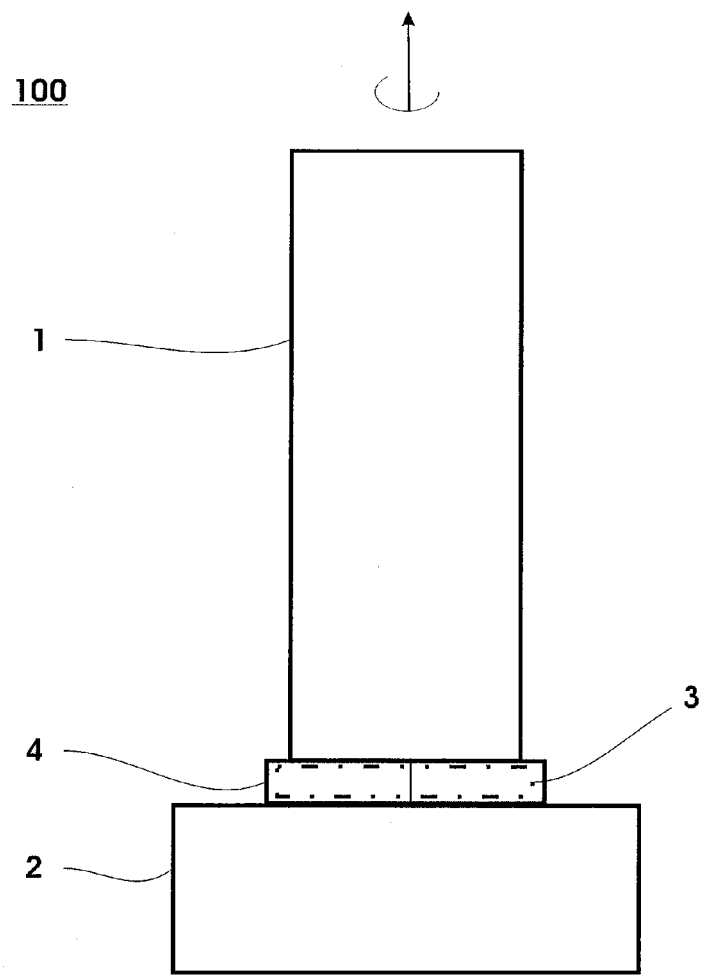
FIG. 1 shows schematically a side view of a device for supporting a rotatable target of a deposition apparatus for sputtering material on a substrate according to embodiments.
Figure 2:
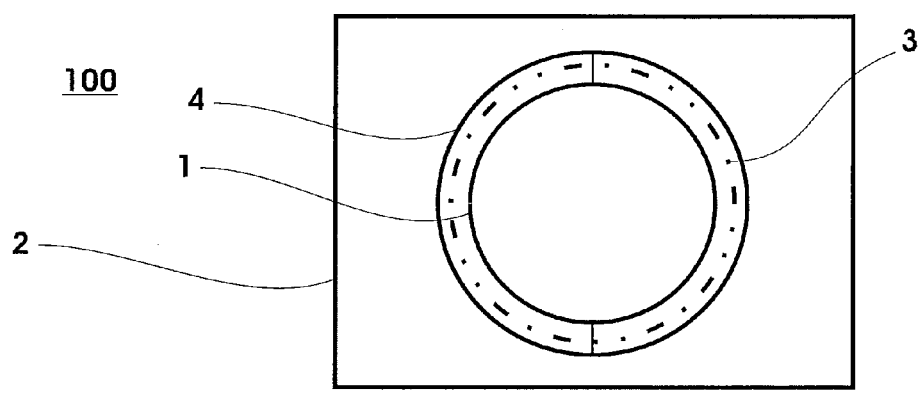
FIG. 2 shows a top view of a device for supporting a rotatable target of a deposition apparatus for sputtering material on a substrate according to embodiments.

With respect to FIGS. 1 and 2, a device 100 for supporting a rotatable target of a deposition apparatus for sputtering material on a substrate is illustrated in a side and top view, respectively. The device includes a drive unit 2 for rotating the rotatable target 1, a ring-shaped part 3 connected to the drive unit 2 for attaching the drive unit to the rotatable target 1, and a dark room shield 4 for covering the ring-shaped part 3. The segmented dark room shield 4 is adapted for rotating together with the ring-shaped part 3 and with the target 1. As shown, the segmented dark room shield 4 is sectioned into two segments (also called "parts" herein). The term "segmented" as used herein, intends to describe a dark room shield as consisting of many parts assembled together. The terms "seg-mented", "multi-part", and "in several parts" are used simultaneously herein. Typically, the shield has an uneven surface with a typical roughness of between RZ 25 and RZ 70.

The dark room shield is segmented into a plurality of segments which can be assembled together. Typically, the at least two parts can be fixed together when the shield is mounted to the ring-shaped part, for instance, by use of a securing device such as a fastener. The segments may be separate pieces, or alternatively, they may be linked together by, e.g., a hinge or a joint. In particular, the hinge or joint may be positioned on the inner side of the segments with respect to the radial direction.

Given the fact that the dark room shield consists of several parts, it can easily be arranged over the ring-shaped part and be mounted thereto. A one-piece shield would have to be placed over the target in order to be arranged over the ring-shaped part. Since targets can have substantial lengths of up to some meters, and since the target material may be easily susceptible to a contact with the shield, the maintenance efforts can be essentially reduced by the use of the multi-part shield as described herein.

The term "rotatable target" as used herein shall refer to any cathode assembly which is adapted to be rotatably mounted to a sputtering installation. Typically, a rotatable target includes a target structure adapted for being sputtered. The term "rotatable target" as used herein shall particularly refer to magnetically-enhanced cathode assemblies, in which the assemblies are enhanced with the addition of internal magnetic units, e.g. permanent magnets, for improved sputtering.

Rotatable targets, in the following also referred to as rotatable sputtering cathodes or rotary cathodes, may be made of a hollow cylindrical body of the target material. These rotary targets are also referred to as monolithic targets and may be manufactured by casting or sintering these targets from the target material.

Non-monolithic rotatable targets typically include a cylindrical rotatable tube, e.g. a backing tube, having a layer of the target material applied to the outer surface thereof In the manufacture of such rotatable sputtering cathodes, the target material may, for example, be applied by spraying onto, or casting or isostatic pressing of powder onto the outer surface of a backing tube. Alternatively, a hollow cylinder of a target material, which may also be referred to as a target tube, may be arranged on and bonded, e.g. with indium, to the backing tube for forming a rotary cathode. According to yet further alternatives, non-bonded target cylinders can be provided radially outward from a backing tube.

In order to obtain increased deposition rates, the use of magnetically-enhanced cathodes has been proposed. This may also be referred to as magnetron sputtering. Magnetic units, which may include an array of magnets, may be arranged inside the sputtering cathode, e.g. inside a backing tube or inside a monolithic target, and provide a magnetic field for magnetically-enhanced sputtering. The cathode is typically rotatable about its longitudinal axis so that it can be turned relative to the magnetic units. At one of the cathode edges, a ring-shaped part adapted for attaching the cathode to the drive unit is mounted at the drive end of the cathode. The term "end" or "edge" as use herein in the context of the rotatable target or cathode shall refer to the end or edge in the axial direction of the cathode or the target. Typically, the outer cross-section of a target or a cathode is circular with a diameter of, for instance, between 8 cm and 30 cm, whereas the length of the target or cathode can be several meters, such as up to 0.3 m or even up to 4 m.

During operation, electrically non-screened cathodes may suffer from gas discharge (arcing) at the cathode edges due to electrical field accumulation. This discharge is not desired at all. The region of gas discharge next to the cathode ends is called a "dark room". According to embodiments described herein, the dark room shield covers the complete ring-shaped part.

To avoid gas discharge on the drive end of the cathode, a shield is provided for screening the dark room region of the target. The shield is typically made of an isolator. Targets screened by means of non-rotating shields may suffer from material deposition only on one side of the dark room shield during the sputtering process. The resulting film formed on the dark room shield surface may break and material flakes may fall onto the substrate, masking the deposition of the sputtered material to the substrate and causing defects in the products.

By means of the dark room shield rotating together with the target and the ring-shaped part as described herein, the whole surface of the dark room shield is exposed to the material deposition, therefore the layer of material is deposited in a uniform manner across the surface of the dark room shield. This means that the film may be deposited for a longer time before breaking and falling onto the substrate, therefore reducing the risk of contamination of the substrate and the maintenance time and costs compared to serving a non-rotating dark room shield.

According to embodiments, the plurality of segments are cylinder segments. That is, assembled together they form a cylindrically shaped shield. Typically, two segments are provided each covering 180° of the cylinder perimeter. According to further embodiments, the shield is assembled from three segments wherein each segment covers 120° of the cylinder.

Typically, the shield is rotationally symmetric in a piecewise manner. The at least two parts of the shield are cylinder section parts covering, for instance, 180° or 120° of the perimeter. Assembled together, the parts form a cylinder which can be, apart from the intersections between the parts, rotationally symmetric. According to the present disclosure, if a part is called "rotational symmetry", the surface is identical after rotating the part. The rotation is undertaken with respect to a centre of rotation which is, in the case of cylinder sections, the centre of the cylinder. A cylinder section covering 360°/n (for instance, n=2 or n=3) can thus be rotated for any degree up to 360°/n degree, and the surface is identical. The term surface does particularly include the surface on the radially outer perimeter.

Figure 8:
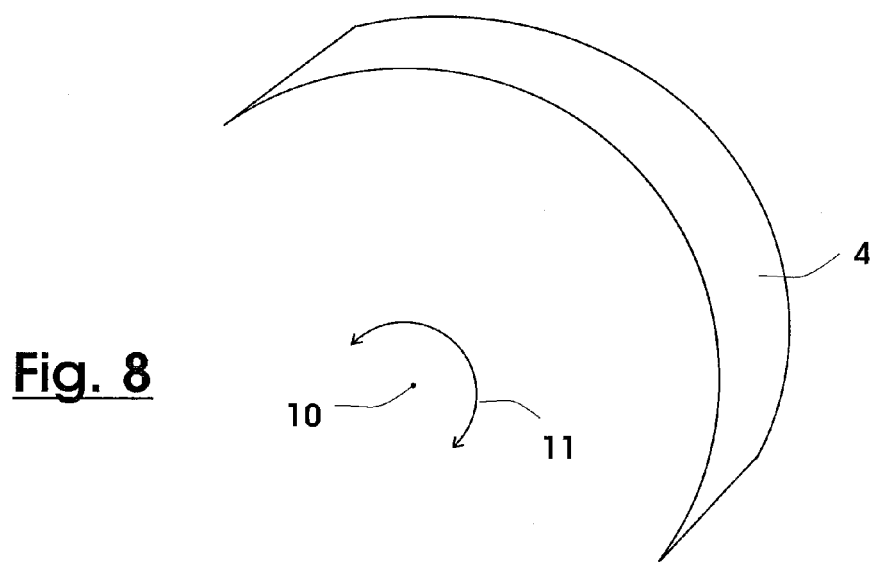
FIG. 8 schematically shows a shield part in a three-dimensional view according to embodiments.

A cross-sectional view of a rotationally symmetric cylinder section is shown in FIG. 8. The shield part 4, which covers 180° of the cylinder, has a center 10. The illustratively shown arrow 11 shall illustrate that the part can be rotated at 180° and the surface, in particular the radially outer surface, is identical.

In particular, according to embodiments described herein, the shield segments do not have a hole, for instance, for receiving screws or pins or the like. A hole would render the shield parts rotationally non-symmetrical. In known shield, holes were provided for assembling the shields with other elements. However, any rotationally non-symmetric shape in the shield results in a disturbance of the electrical field during sputtering. This, in turn, results in a reduced homogeneity of the layer on the coated substrates.

In addition, the holes are provided for allowing screws or the like to be inserted. Hence, in order to dissemble or demount the shield, for instance for maintenance, it was necessary to unscrew the screws. This is time consuming in particular because the screw head becomes coated during sputtering, and, in order to dissemble or demount the shield, it is necessary to, first, remove the coating from the screws' heads, and second, to unscrew them.

Hence, providing a rotationally symmetric shield without any rotationally non-symmetric elements such as a hole does not only improve the coating quality but reduces also the maintenance efforts and costs.

In embodiments, it is of relevance that the needed room between coating chamber wall and target is as small as possible. Since coating regularly takes place in a vacuum condition, it can be important to reduce the volume of the chamber in order to reduce the costs and the time for evacuating the chamber. One possibility to reduce the volume is to reduce the space needed for the drive and the fixation of the target to the drive.

In order to do so, according to some embodiments, the shield has a maximum length (which is understood as the axial dimension of the shield, whereas the axial direction of the shield refers to the axial direction of the target) of 0.5 of the diameter of the shield, typically at maximum 0.3 such as 0.25. In absolute terms, the shield length is below 10 cm according to embodiments, typically below 6 cm such as 4.5 cm. Hence, in comparison to a rotatable target having a length of, for instance, 2 m, the shield length is below 5% of the length of the rotatable target. The effect is that there is only little space needed, and the resulting room to be evacuated is rather small.

According to an aspect, the length of the shield is reduced. It is typical that also the length of the drive unit is minimized. Examples of a compact set-up are described in U.S. patent application Ser. No. 12/757,765, entitled "Device for supporting a rotatable target and sputtering installation" filed Apr. 9, 2010, which corresponds to EP application 10159022.2 (equally entitled) which is incorporated herein by reference to the extent the application is not inconsistent with the present disclosure. Particular reference is made to paragraphs 6-8 which illustrate a device for supporting a rotatable target being provided with fluid conduits and a compact end-block design. Further reference is made to the substantial-matter as defined in claims 6 and 9, illustrating a set-up with three fluid conduits and describing the electrical contact (which is referenced 135 therein).

According to specific embodiments, which can be combined with other embodiments described herein, the device further includes a top shield. The top shield is positioned at the top end of the rotatable target. The term "top end" shall be understood as the end of the target which is opposite, in axial direction, to the end which is connected to the drive (called "drive end" of the rotatable target herein). The top shield is adapted for rotating together with the rotatable target.

According to typical embodiments, the top shield looks identical to the shield described herein which is intended to cover the ring-shaped part. Hence, all the features, details and aspects described for this shield can be applied also to the top shield.

Figure 9:
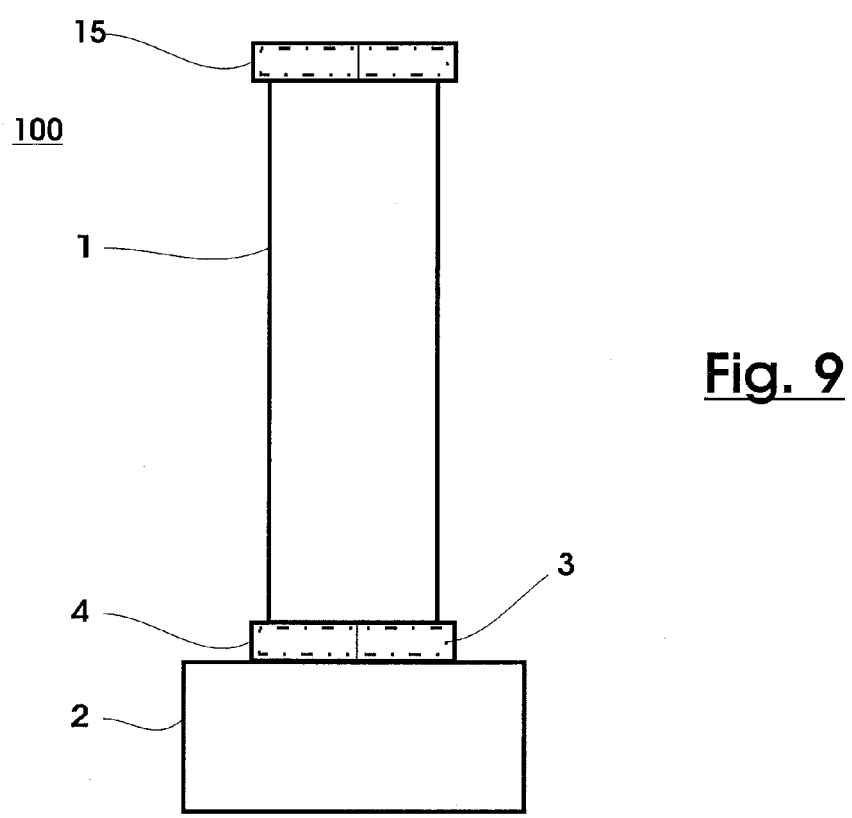
FIG. 9 schematically shows a side view of a device for supporting a rotatable target of a deposition apparatus for sputtering material on a substrate according to embodiments.

FIG. 9 shows a schematic embodiment having both the shield 4 connected at the drive end of the rotatable target 1, and the top end shield 15 at the top end of the rotatable target. Both shields as shown are two-part shields, i.e., each includes two segments. Having the same shield on the top end and at the drive end of the rotatable target reduces the number of shields to be stored for maintenance, and it simplifies construction and maintenance. However, since the drive end is connected to the drive whereas the top end is freely rotating, using the same shield for both ends has not yet been considered. In particular, shields at the drive end as known to the inventors are not rotating but their position is fixed.

According to embodiments, the shield is assembled concentrically to the ring-shaped part and/or to the rotatable target. Typically, the shield parts are assembled concentrically to the ring-shaped part and/or the rotatable target.

The shield is typically electrically isolated from the ring-shaped part or the rotatable target. For instance, the ring-shaped part may be provided with a plurality of spacers. The spacers are thus typically made of isolating material. The spacers may include screws fastened to the ring-shaped part with heads extruding from the ring-shaped part. According to other embodiments, the spacers are clamping rods.

With respect to the remaining drawings, embodiments pertaining to devices for screening the edges of a rotatable target of a deposition apparatus as in FIGS. 1 and 2 are explained in more detail. Generally, the term "dark room shield" as used herein shall refer to a device which is adapted to screen the edge of a rotatable target and/or the ring shaped part for attaching the rotatable target to the drive unit from electrical discharge (arcing). The term "screening" shall be used interchangeably to "covering" herein. That is, by covering e.g. the ring-shaped part, the ring-shaped part is screened from electrical discharge. Typically, the dark room shield is mounted concentrically to a rotatable target while remaining electrically isolated from the target. The dark room shield rotates together with the rotatable target. The terms "dark room shield", "rotatable cathode shielding", "dark space shield" are used interchangeably herein. The terms "dark room shield", "rotatable cathode shielding", "dark space shield" as used herein shall particularly refer to shields which provide electrical screening of the ring-shaped part.

Figure 3:
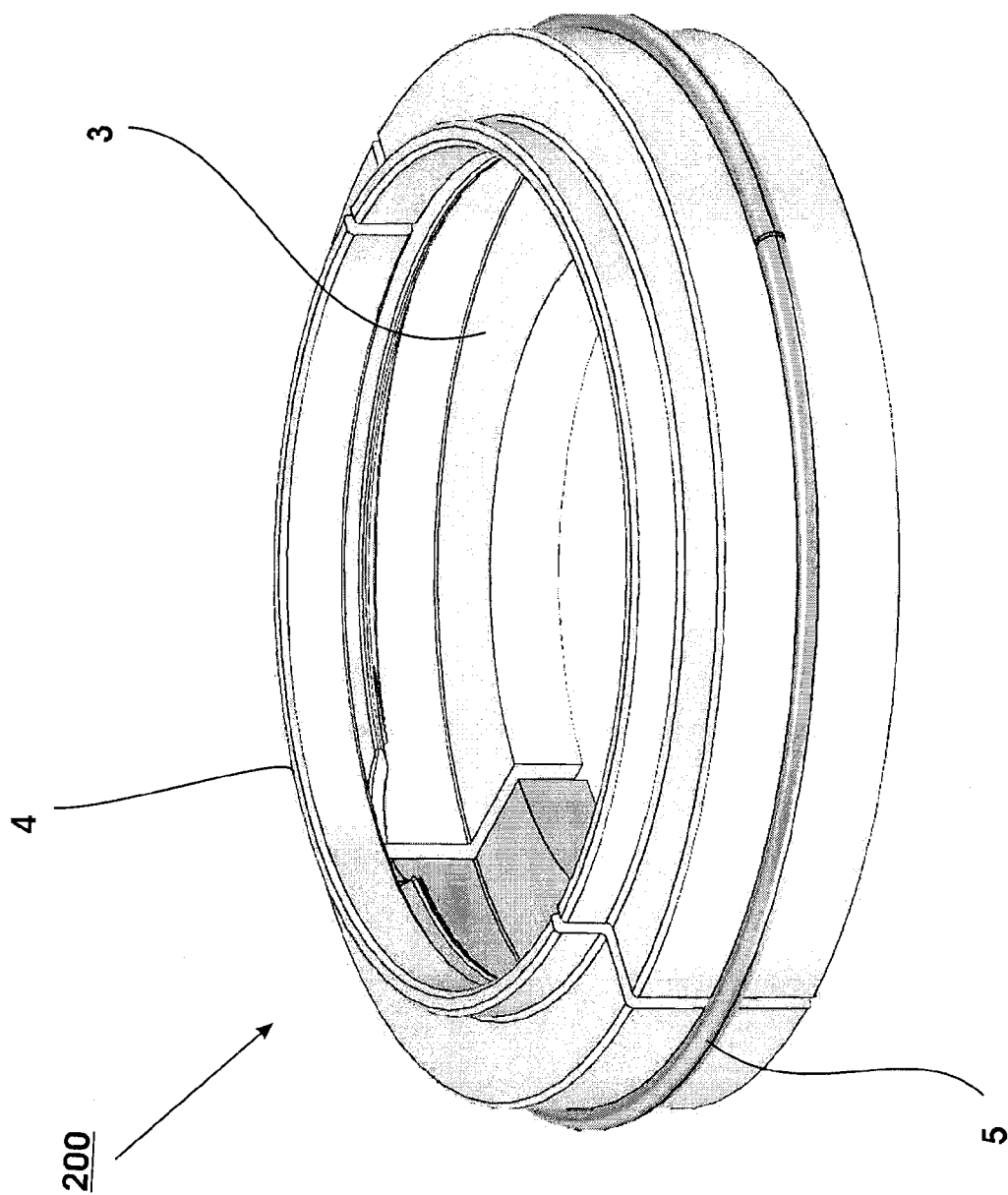
FIG. 3 shows schematically a dark room shield mounted concentrically to the ring-shaped part of a rotatable target according to embodiments.

FIG. 3 shows schematically an excerpt 200 of a device for supporting a rotatable target. The two-part dark room shield 4 is assembled around a ring-shaped part 3 which is employed to connect the rotatable target (not shown) to the drive unit (not shown). Not limited to FIG. 3, the ring-shaped part 3 may be a clamp ring to which the target may be connected at one end, and to the other end the rotating part of the drive unit. An example of a drive unit may be a drop in drive but other examples of drive units may be employed.

The term "ring-shaped part" as used herein shall refer to any part connecting the rotatable cathode to the drive unit by fastening or clamping devices. The terms "ring-shaped part" can particularly be a "clamp ring", "clamp collar", "retaining ring" and "locking ring". The fastener is typically comprised of a noble metal.

The dark room shield is segmented, i.e. it comprises several parts, typically in the shape of circle or cylinder segments. A securing device 5 may fixate the several parts of the dark room shield together. According to embodiments, which may be combined with other embodiments described herein, to lodge the securing device 5 firmly, it is possible to provide one or more notched trenches, channels, or hollows in the dark room shield which are typically formed along the radially outer perimeter of the dark room shield. One or more snap-like securing devices may be inserted with a snap into the trenches, thus stabilizing the dark room shield. The notched trench may be positioned in the middle of the shield with respect to its axial direction.

The term "securing device" 5 as used herein intends to describe means for fixating or fastening together the parts forming the dark room shield thereby forming an assembly. A securing device may include a snap ring, a spring circlip, a spring lock, an endless spring, an elastic belt or the like.

The term "several parts" referred herein, may comprise n parts, typically each of 1/n of the perimeter length of a circle, adaptable to the target clamp ring. The figure n is typically two, three or four. The term "parts" may refer to "shells" or "frames" and their shape is adapted for enclosing the ring-shaped part attached to the target drive end. The parts may have at least one trench or channel formed on their external surface along the perimeter. Typically, the parts are to be assembled together by means of the securing device such as a snap ring. As can be seen in FIG. 3, the securing device 5 is lodged into such a trench or channel.

In order to not contaminate the substrate during sputtering, the shield must not release particles when it is bombarded from the ions of the processing gas. The shield segments, such as the shells or frames, may consist of disposable material, for example metal, in particular a noble metal. It may consist of an oxidizing material such as steel, Aluminum, Titanium, Copper. According to other embodiments, the shield is made of a non-oxidizing material. A dark room shield including a plurality of segments such as frames may be advantageous because it may be easily replaced without incurring in high costs for material disposal and maintenance, as it may be removed by separating the frame parts. Hereto in contrast, a one piece shield has to be extracted in the concentric direction of the target after having removed all the securing devices which attach it to the chamber or to the drive unit.

The dark room shield of the present disclosure may be replaced by cutting or removing the securing device 5. The parts composing the shield are then free to be removed and may be replaced with new parts to be assembled around the ring-shaped part. They may be fixed by means of a securing device, for instance, to be placed within the trenches formed on the peripheral surface of the parts. The trench or channel 7 formed along the external surface of the elements of the shield will lodge the securing device 5 in a lock position, keeping the parts assembled together onto the system shown in FIG. 3.

Figure 4:
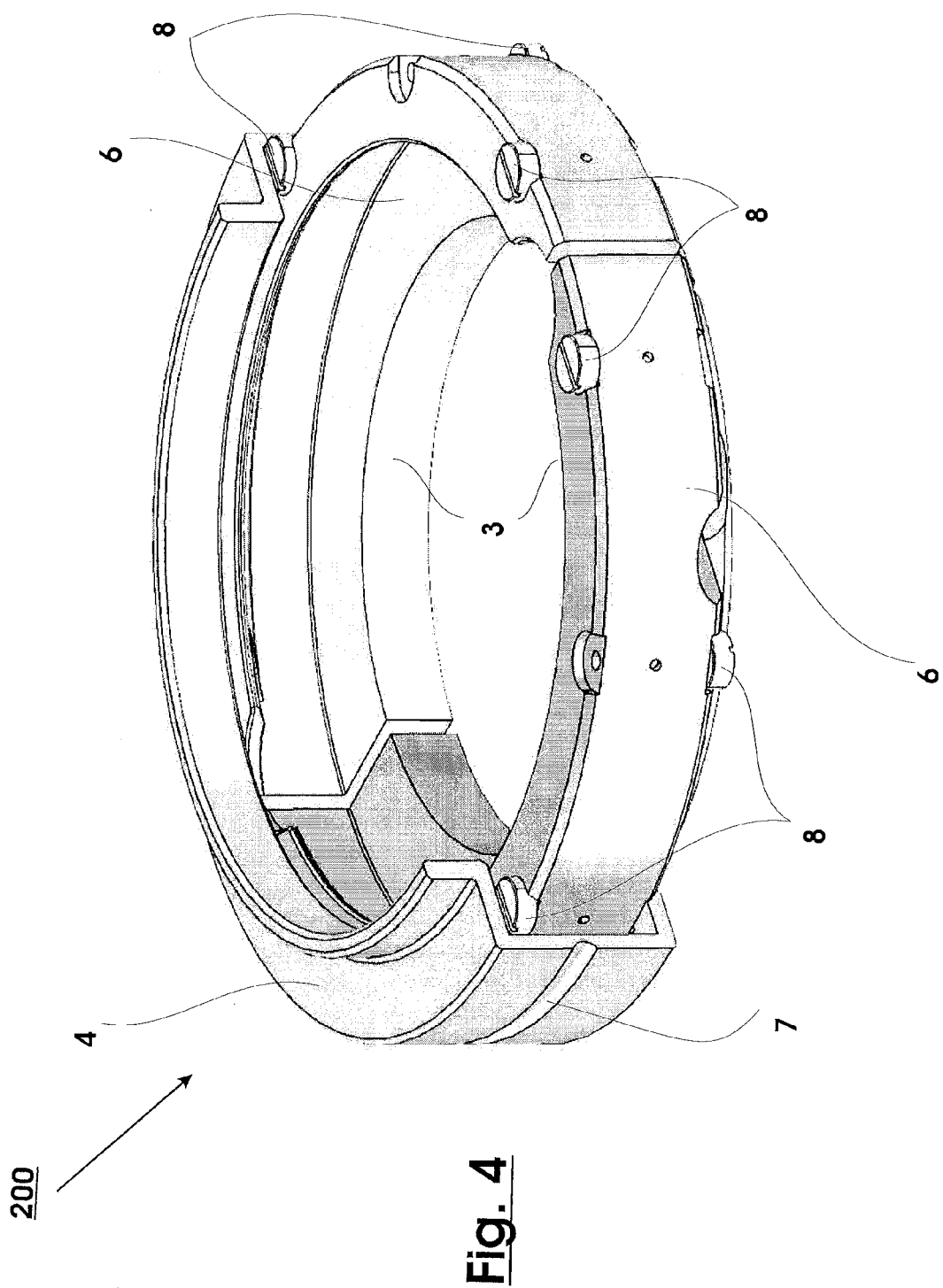
FIG. 4 shows schematically a sectioned view of a dark room shield mounted concentrically to the ring-shaped part of a rotatable target according to embodiments.

FIG. 4 is a schematical sectional view of an excerpt 200 of the device for supporting a rotatable target. For illustrative purposes, one of the two parts of the dark room shield 4 has been removed. The ring-shaped part 3 may be a clamp ring composed of the assembly of semicircular elements 6. The dark room shield 4 is electrically isolated from the ring-shaped part 3 by means of the fastened spacers 8, the heads of which protrude from the surface of the clamp ring elements 6 to keep the inner surface of the dark room shield element at a fixed distance from the surface of the ring-shaped part, thus preventing contact between the two elements.

According to embodiments, which may be combined with other embodiments disclosed herein, the dark room shield is electrically isolated from the target by means of spacers mounted on the ring-shaped part. The spacers may be insulating units, the purpose of which is to electrically isolate the clamp ring and the dark room shield. The insulating units may be realized with an insulating material; a suitable insulating material may be any ceramics or thermo-resistant plastic such as Melding, PEEK or the like.

Figure 5:
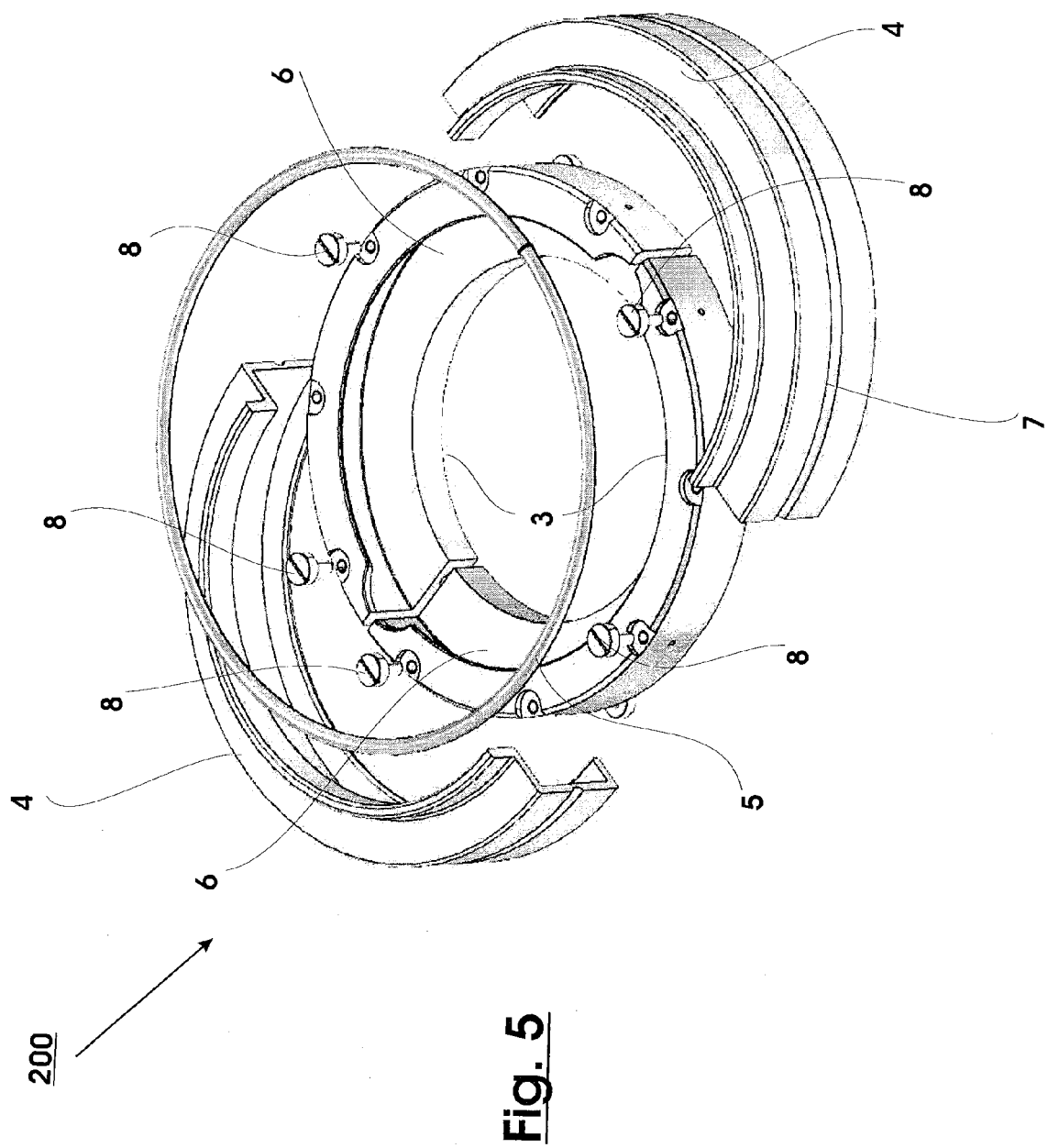
FIG. 5 shows schematically an exploded view of a dark room shield mounted concentrically to the ring-shaped part of a rotatable target according to embodiments.

FIG. 5 shows an exploded view in which the elements shown in previous drawings are assembled to form the device for supporting a rotatable target wherein only the excerpt 200 is shown. The spacers 8 may be of insulating material in order to electrically isolate the ring-shaped part and the dark room shield. The parts 4 forming the dark room shield are shown as two semicircular segments which, assembled together, form a ring enclosing the target clamp ring concentrically. The inner surface of the dark room shield are kept separated from the surface of the ring-shaped part 4 by means of the spacers 8, thus keeping the dark room shield electrically isolated from the target clamp ring.

According to embodiments, which may be combined with other embodiments disclosed herein, the spacers may include screws, clamping rods, clips or pinions clamped to the target clamp ring. In the case where the spacers 8 include screws, as shown in FIG. 5, the screws are fastened to the target clamp ring elements 6 in such a manner that the heads of the screws protrude from the surface of the target clamp ring.

Figure 6:
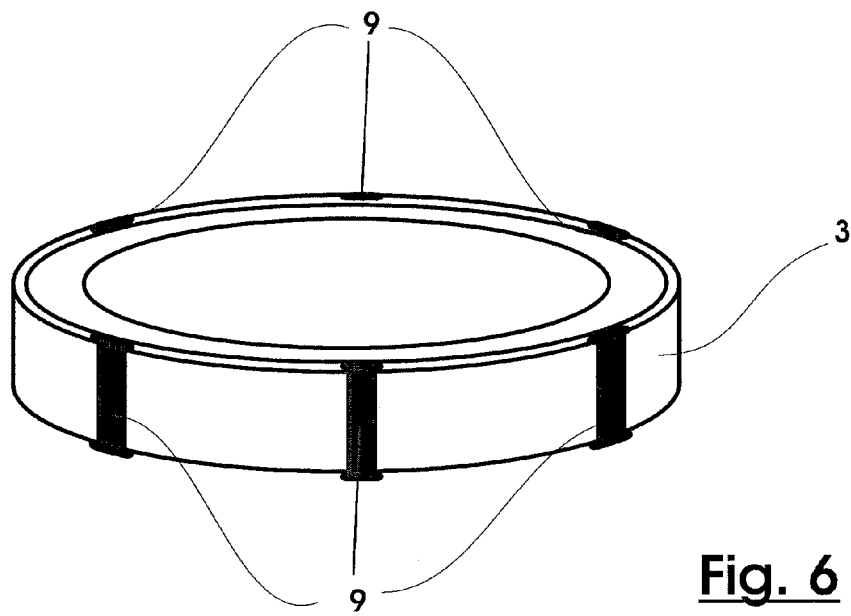
FIG. 6 shows schematically a section of a ring shaped part according to embodiments.

FIG. 6 shows the case where the spacers include clamping rods 9 clamped to the target clamp ring 3. The clamping rods 9 may have a head protruding from the clamp ring surface, which separates the internal surface of the dark room shield from the surface of the target clamp ring, thus electrically isolating the dark room shield from the target clamp ring.

Figure 7:
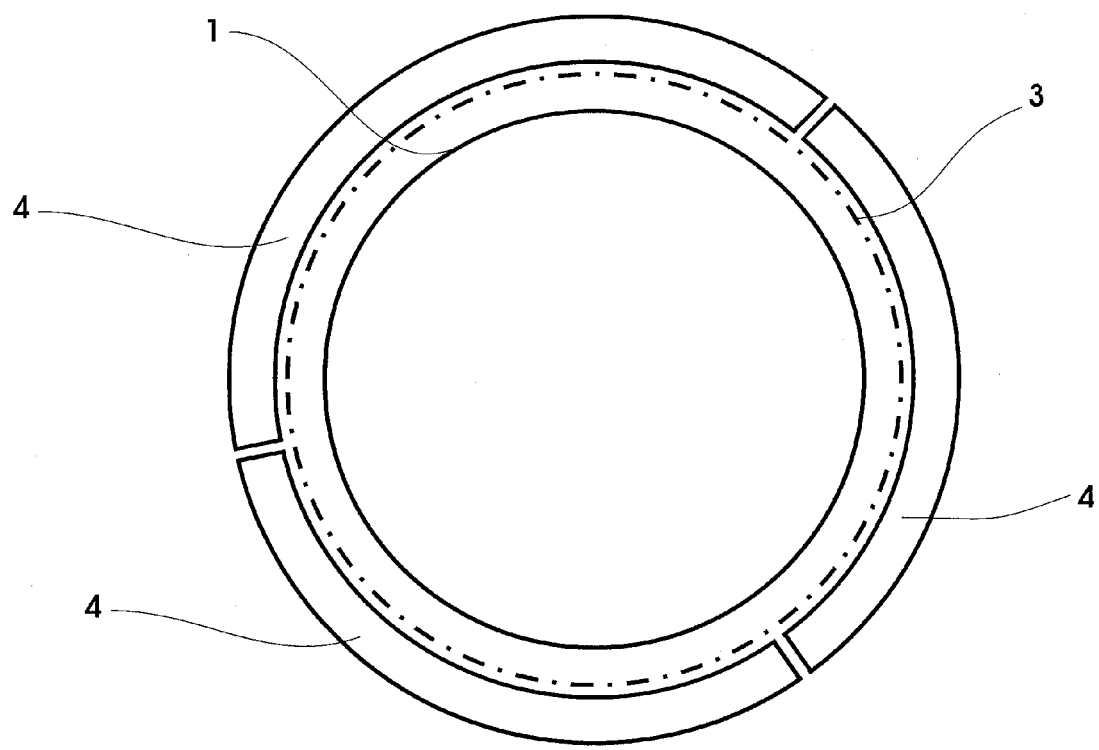
FIG. 7 shows schematically a top view of a dark room shield according to embodiments.

In FIG. 7 another embodiment of a dark room shield is shown which is formed by more than two parts. The parts 4 forming the dark room shield are shown as three circular parts 4, typically each of ⅓ of the perimeter length of a cylinder (i.e., 120°), and assembled together to form a ring enclosing the target clamp ring 3 concentrically. The dark room shield may be formed by more than two parts, preferably up to four, fastened together by a securing device, not shown in FIG. 7.

According to embodiments, which may be combined with other embodiments disclosed herein, the dark room shield may include one single elastic ring shaped shell, attached concentrically to the ring-shaped part by means of a spring lock. The shell adheres firmly to the ring-shaped part due to the pressure exerted by the fastened spring lock. The dark room shield may be exchanged by unfastening the spring lock and slipping off the shell along the target main body.

The dark room shield presented herein presents several advantages. Firstly, exchanging the parts forming the dark room shield is rendered easy by means of the removal of the securing device, thus eliminating cumbersome and time consuming operations during the maintenance of the target. Further, the rotation of the dark room shield together with the target promotes a much more uniform coating of sputtered material over the entire surface of the dark room shield, avoiding the formation of a film of material only on a small area of the dark room shield surface, as is often the case in non-rotating dark room shields. The result is a considerable reduction of the risk of contamination of the sputtered substrates due to the reduced flaking of material onto the substrate. Furthermore, as the whole surface of the dark room shield is coated in a more uniform manner, the rotating dark room shield does not suffer from local overheating, due to the collisions of the processing gas ions.

Figure 10:
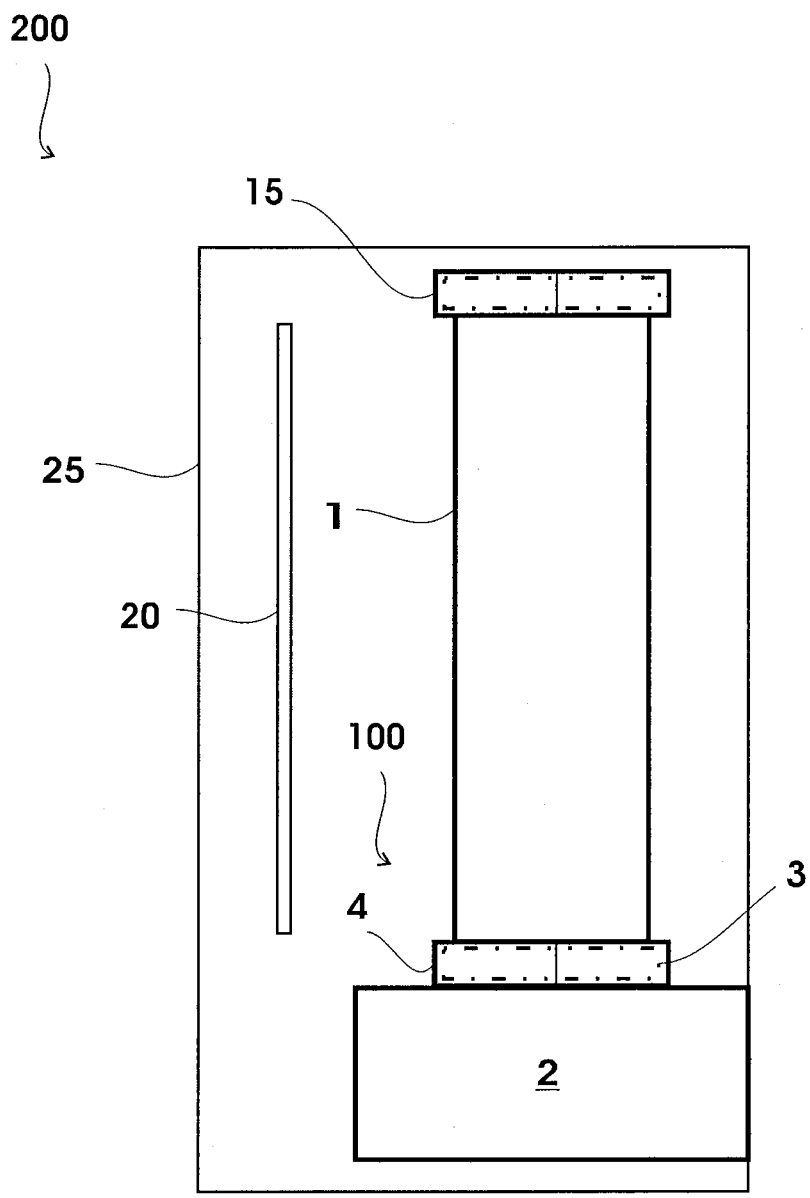
FIG. 10 schematically shows a sputtering apparatus according to embodiments described herein.

FIG. 10 schematically shows a sputtering apparatus 200 having the device for supporting a rotatable target 100 as described herein. Further, the substrate 20 is shown which is coated during operation. Generally, and not limited to this embodiment, the device for supporting the rotatable target is typically located within a vacuum chamber 25.

The embodiment illustrated in FIG. 10 shows a so-called "drop-in drive" wherein the device for supporting the rotatable target is inserted into the vacuum chamber from the side. The device for supporting the rotatable target is mounted to the vacuum chamber wall. Such a set-up has a particular high space limitation, i.e., the length of the shield in an axial direction should be minimized.

Examples of a device for supporting a rotatable target, in particular in the embodiment of a drop-in drive, are described in U.S. patent application Ser. No. 12/757,752, entitled "End block and sputtering installation" filed Apr. 9, 2010, which corresponds to EP application 10159023.0 (equally entitled), which is incorporated herein by reference to the extent the application is not inconsistent with this disclosure. Particular reference is made to FIG. 4 and FIG. 6 and the related description. Furthermore, the end-block as described in particular in claim 6 of that application can be equally applied in the present application.

This written description uses examples to disclose the invention, including the best mode, and also to enable any person skilled in the art to practice the described subject-matter, including making and using any devices or systems and performing any incorporated methods. While various specific embodiments have been disclosed in the foregoing, those skilled in the art will recognize that the spirit and scope of the claims allows for equally effective modifications. Especially, mutually non-exclusive features of the embodiments described above may be combined with each other. The patentable scope is defined by the claims, and may include such modifications and other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A device for supporting a rotatable target of a deposition apparatus for sputtering material onto a substrate, the device comprising:
    a drive unit for rotating the rotatable target;
    a ring-shaped part connected to the drive unit for attaching the drive unit to the rotatable target; and,
    a segmented shield for covering the ring-shaped part;
    wherein said segmented shield is adapted for rotating together with said ring-shaped part; and
    wherein the segmented shield comprises a plurality of parts assembled together, each part for covering, at a radial distance from a central axis of the rind shaped part, less than a full circumference thereof.

2. The device of claim 1, wherein the plurality of parts are cylinder section parts forming a piecewise rotationally symmetric segmented shield.

3. The device of claim 2, wherein the parts are provided without a hole.

4. The device of claim 1, wherein the ratio of the length of the shield and the diameter of the shield is at maximum 0.5.

5. The device of claim 1, wherein the ratio of the length of the shield and the diameter of the shield is at maximum 0.3.

6. The device of claim 1, further comprising a top shield positioned at the top end of the rotatable target, wherein the top shield is adapted for rotating together with the rotatable target, and wherein the top shield comprises a plurality of parts assembled together.

7. The device of claim 6 wherein the segmented shield and the top shield are identical.

8. The device of claim 1, wherein the shield comprises two parts assembled together.

9. The device of any of claim 1, wherein said plurality of parts are assembled together by means of at least one securing device.

10. The device of claim 9, wherein the securing device comprises a snap ring.

11. The device of claim 1, wherein the shield comprises at least one notched channel along its perimeter for positioning at least one snap ring therein.

12. The device of claim 1, wherein said shield is electrically isolated from said ring-shaped part by means of at least one spacer.

13. The device of claim 12, wherein the at least one spacer comprises a plurality of clamping rods.

14. The device of claim 12, wherein the at least one spacer is comprised of insulating material.

15. The device of claim 14, wherein the insulating material comprises a thermal-resistant plastic.

16. Sputtering apparatus with at least one device for supporting a rotatable target of a deposition apparatus for sputtering material onto a substrate, the device comprising:
- a drive unit for rotating the rotatable target;
- a ring-shaped part connected to the drive unit for attaching the drive unit to the rotatable target; and,
- a segmented shield for covering the ring-shaped part;
- wherein said segmented shield is adapted for rotating together with said ring-shaped part; and
- wherein the segmented shield comprises a plurality of parts assembled together, each part for covering, at a radial distance from a central axis of the ring shaped part, less than a full circumference thereof.

17. A method for supporting a rotatable target of a deposition apparatus for sputtering material on a substrate, the method comprising:
- providing a drive unit for rotating the rotatable target and a ring-shaped part connected to the rotatable target;
- assembling a plurality of parts together thereby forming a segmented shield for covering the ring-shaped part at a radial distance from a central axis of the ring shaped part, wherein each part covers less than a full circumference of the ring shaped part;
- wherein said segmented shield is connected to the ring-shaped part such that it covers said ring-shaped part and rotates together with said ring-shaped part.

18. The method of claim 17, wherein the segmented shield comprises a plurality of parts assembled concentrically to said ring-shaped part by means of a securing device.

19. The method of claim 18 wherein the securing device is a snap ring.

20. The device of claim 1, wherein the parts are segments linked together.

* * * * *

UNITED STATES PATENT AND TRADEMARK OFFICE
CERTIFICATE OF CORRECTION

PATENT NO. : 8,623,184 B2  
APPLICATION NO. : 13/019843  
DATED : January 7, 2014  
INVENTOR(S) : Frank Schnappenberger et al.

Page 1 of 1

It is certified that error appears in the above-identified patent and that said Letters Patent is hereby corrected as shown below:

In the Specifications:

In Detailed Description:

Column 8, Line 52, please delete "Melding" and insert --Meldin®-- therefor;

In the Claims:

Column 10, Claim 1, Line 31, please delete "rind" and insert --ring-- therefor.

Signed and Sealed this  
Twentieth Day of May, 2014

Michelle K. Lee  
*Deputy Director of the United States Patent and Trademark Office*